(12) United States Patent
Perry et al.

(10) Patent No.: US 8,739,108 B1
(45) Date of Patent: May 27, 2014

(54) METHOD AND APPARATUS FOR IMPLEMENTING LOOP-BASED CONTROL IN AN ELECTRONIC DESIGN AUTOMATION TOOL

(75) Inventors: Steven Perry, High Wycombe (GB); Simon Finn, High Wycombe (GB)

(73) Assignee: Altera Corporation, San Jose, CA (US)

( * ) Notice: Subject to any disclaimer, the term of this patent is extended or adjusted under 35 U.S.C. 154(b) by 145 days.

(21) Appl. No.: 13/199,588

(22) Filed: Sep. 3, 2011

(51) Int. Cl.
*G06F 15/04* (2006.01)
*G06F 17/50* (2006.01)

(52) U.S. Cl.
USPC ............................ 716/139; 716/117; 716/136

(58) Field of Classification Search
USPC ......................................................... 716/139
See application file for complete search history.

(56) References Cited

U.S. PATENT DOCUMENTS 6,728,945 B1 * 4/2004 Wang ............................ 716/103
2003/0196194 A1 * 10/2003 Johns et al. .................... 717/136

* cited by examiner

*Primary Examiner* — Vuthe Siek
*Assistant Examiner* — Eric Lee
(74) *Attorney, Agent, or Firm* — L. Cho

(57) ABSTRACT

A selectable block in a graphical user interface of an electric design automation tool for generating a design of a system on a target device includes a token passing unit operable to pass a token through one of a first output port and second output port in response to a result from a loop test. The selectable block also includes a counter operable to increment a step value in response to the selectable block receiving the token at a first input port.

20 Claims, 16 Drawing Sheets

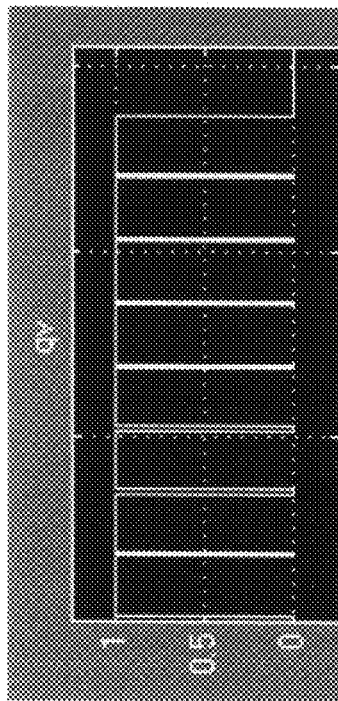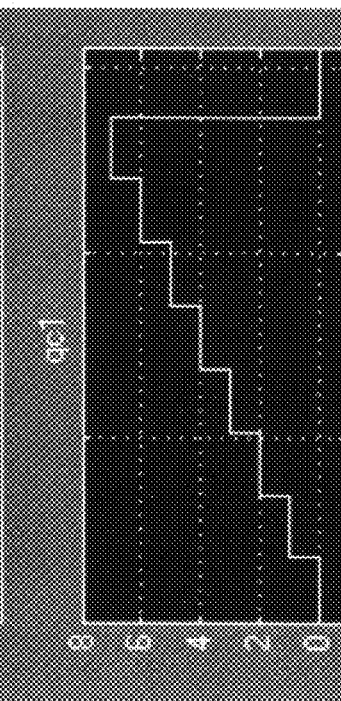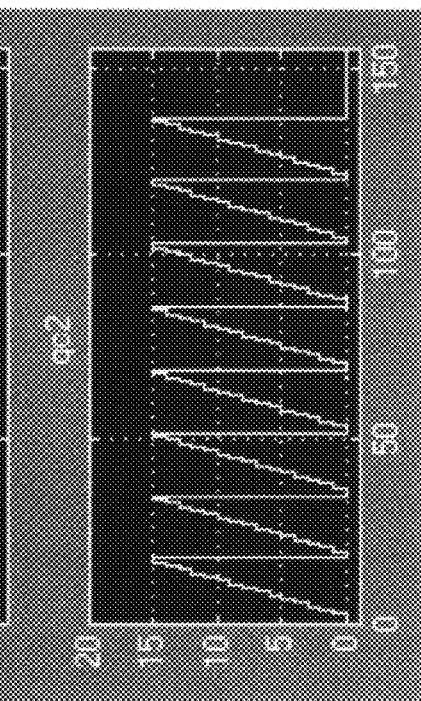

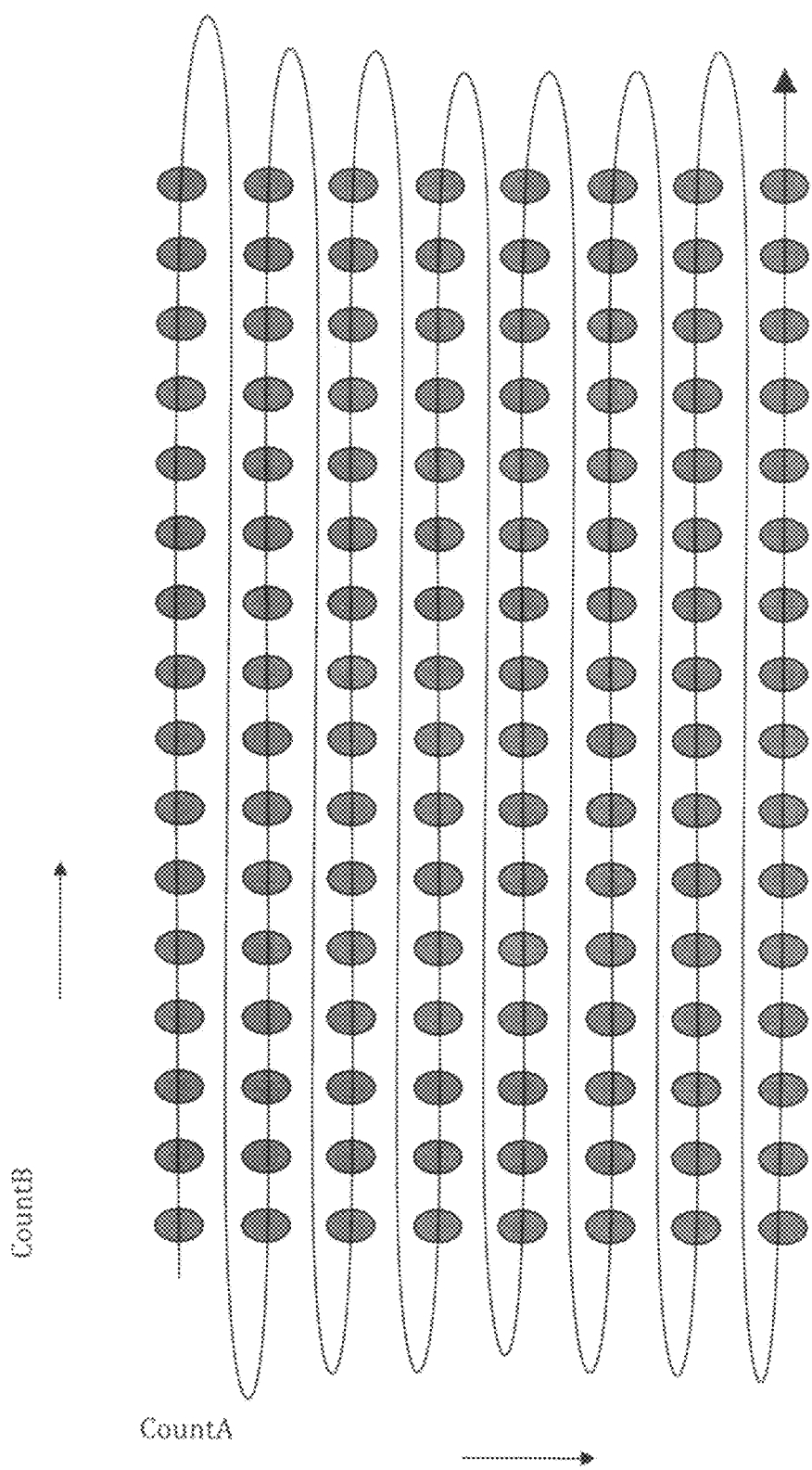

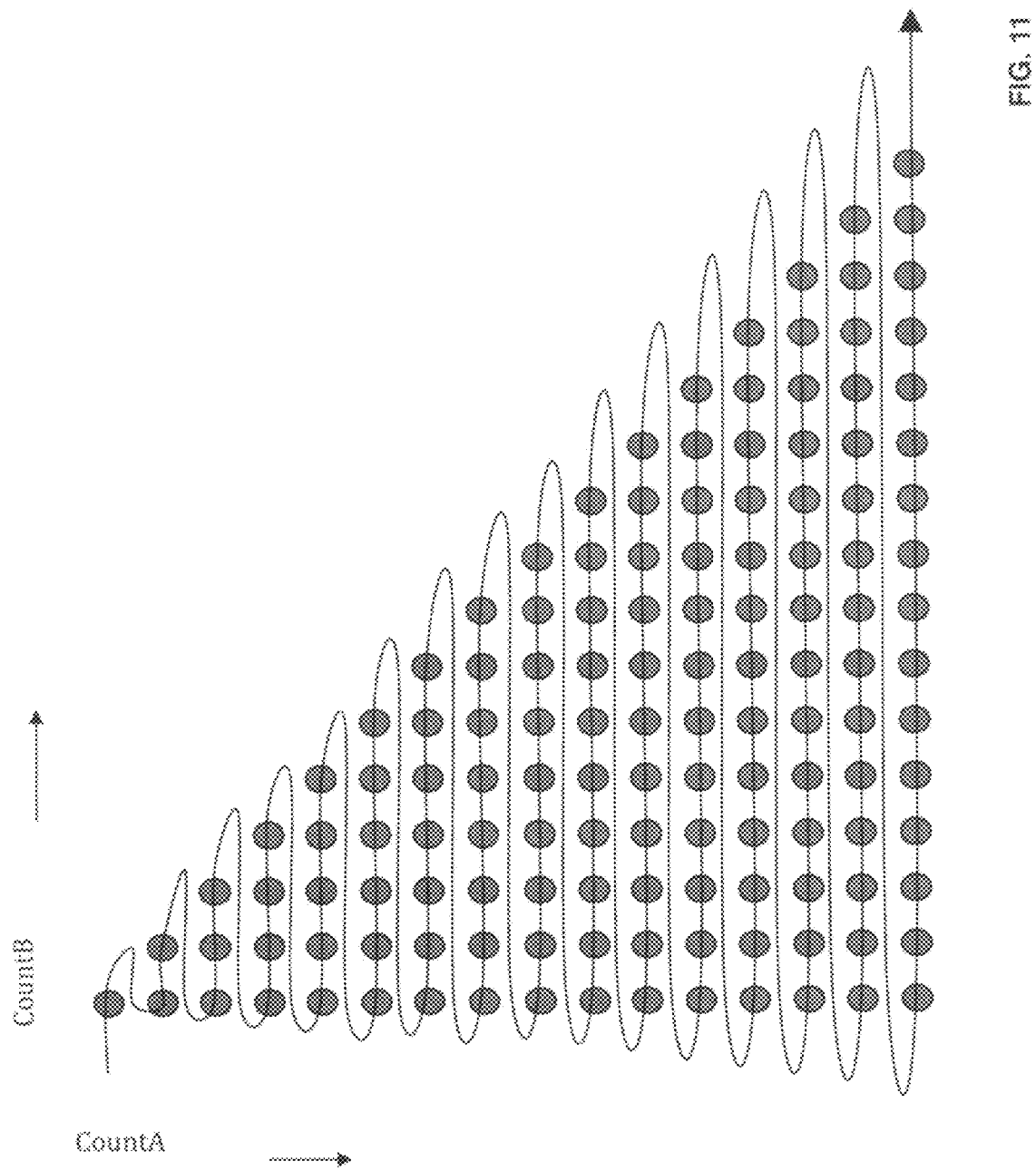

METHOD AND APPARATUS FOR IMPLEMENTING LOOP-BASED CONTROL IN AN ELECTRONIC DESIGN AUTOMATION TOOL

TECHNICAL FIELD

Embodiments of the present invention relate to tools such as electronic design automation (EDA) tools for designing systems on target devices such as field programmable gate arrays (FPGAs). More specifically, embodiments of the present invention relate to a method and apparatus for implementing a loop-based control in an EDA tool.

BACKGROUND

Logic devices are used to implement large systems that may include million of gates and megabits of embedded memory. The complexity of large systems often requires the use of EDA tools to create and optimize a design for the system onto physical target devices. Among the procedures performed by EDA tools in a computer aided design (CAD) flow are synthesis, mapping, placement, and routing.

Prior to synthesis, a description of the system may also be generated by the EDA tool. The description of the system may include a register transfer level (RTL) description to describe the operation of synchronous digital circuits. In RTL design, a circuit's behavior is defined in terms of the flow of signals between hardware registers and the logical operations performed on those signals. RTL abstraction is used in hardware description languages such as Verilog and very-high-speed integrated circuit (VHSIC) hardware description language (VHDL) to create high-level representations of a circuit, from which lower-level representations and can be derived.

In the past, EDA tools with schematic-based graphical user interface provided limited options to control data paths in a design for a system. This made it challenging for a designer to implement control structures such as irregular loops. As a result, the designer would often need to directly input control structure using RTL. This would require additional time and effort from the designer and prevent the designer from utilizing some of the features of the EDA tool.

SUMMARY

According to an embodiment of the present invention, an electric design automation (EDA) tool for generating a design of a system on a programmable device is disclosed. The EDA tool includes a graphical user interface to create a block based schematic. The EDA tool includes a library that includes functional units, in the form of blocks, selectable with the graphical user interface to form the block based schematic. The library also includes a For Loop block selectable to represent a component in the design that is operable to control data paths. The For Loop block includes a token passing unit that is operable to pass a token through either a first output port or a second output port depending on a result from a loop test. The For Loop block also includes a counter that is operable to increment a step value in response to the For Loop block receiving the token.

According to an embodiment of the present invention, the For Loop block utilizes the token passing unit and counter to implement a single level of looping. N number of For Loop blocks may be connected to build an N-depth nested loop. Alternatively, N number of For Loop blocks may be arranged to implement N number of sequential loops. Step and limits may be programmed by the designer to implement irregular loops such as triangular loops where an inner loop is a function of an outer loop count.

BRIEF DESCRIPTION OF THE DRAWINGS

The features and advantages of the present invention are illustrated by way of example and are by no means intended to limit the scope of the present invention to the particular embodiments shown.

FIG. 1 illustrates a block diagram of a computer system in which an EDA tool in accordance with one embodiment of the present invention may be implemented on.

FIG. 7 illustrates the outputs of the circuit of FIG. 6 according to an exemplary embodiment of the present invention.

FIG. 8 illustrates a loop diagram of a rectangular nested loop according to an exemplary embodiment of the present invention.

FIG. 11 illustrates a loop diagram of the triangular nested loop according to an exemplary embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
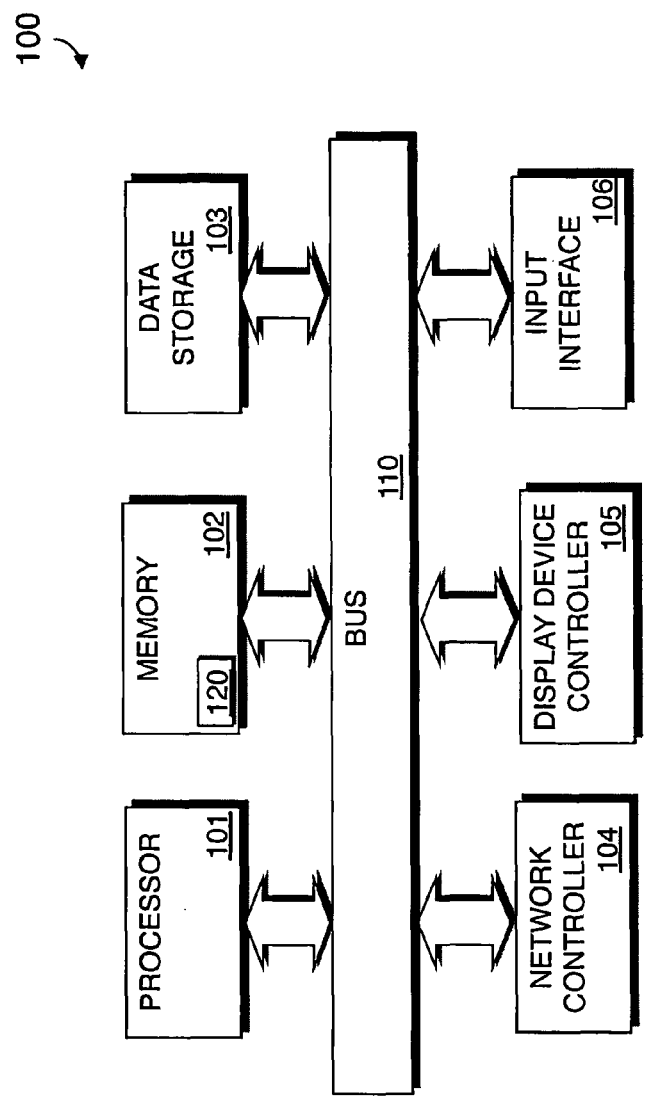

FIG. 1 is a block diagram of an exemplary computer system 100 in which an example embodiment of the present invention resides. The computer system 100 may be used to implement a system designer such as an EDA tool. The computer system 100 includes a processor 101 that processes data signals. The processor 101 is coupled to a bus 110 that transmits data signals between components in the computer system 100. The bus 110 may be a single bus or a combination of multiple buses. The computer system 100 includes a memory 102. The memory 102 may be a dynamic random access memory device, a static random access memory device, and/or other memory device. The memory 102 may store instructions and code represented by data signals that may be executed by the processor 101. A data storage device 103 is coupled to the bus 110. The data storage device 103 may be a hard disk drive, a floppy disk drive, a CD-ROM device, a flash memory device or other mass storage device.

A network controller 104 is coupled to the bus 110. The network controller 104 may link the computer system 100 to a network of computers (not shown) and supports communication among the machines. A display device controller 105 is coupled to the bus 110. The display device controller 105 allows coupling of a display device (not shown) to the computer system 100 and acts as an interface between the display device and the computer system 100. An input interface 106 is coupled to the bus 110. The input interface 106 may be, for example, a keyboard and/or mouse controller or other input interface. The input interface 106 allows coupling of an input device to the computer system 100 and transmits data signals from an input device to the computer system 100. It should be appreciated that computer systems having a different architecture or having different components may also be used to implement the computer system 100.

According to an embodiment of the present invention, a system designer 120 may reside in memory 102 and be executed by the processor 101. The system designer 120 may operate to generate a description of a system, synthesize, map, place and route the system onto a target device.

Figure 2:
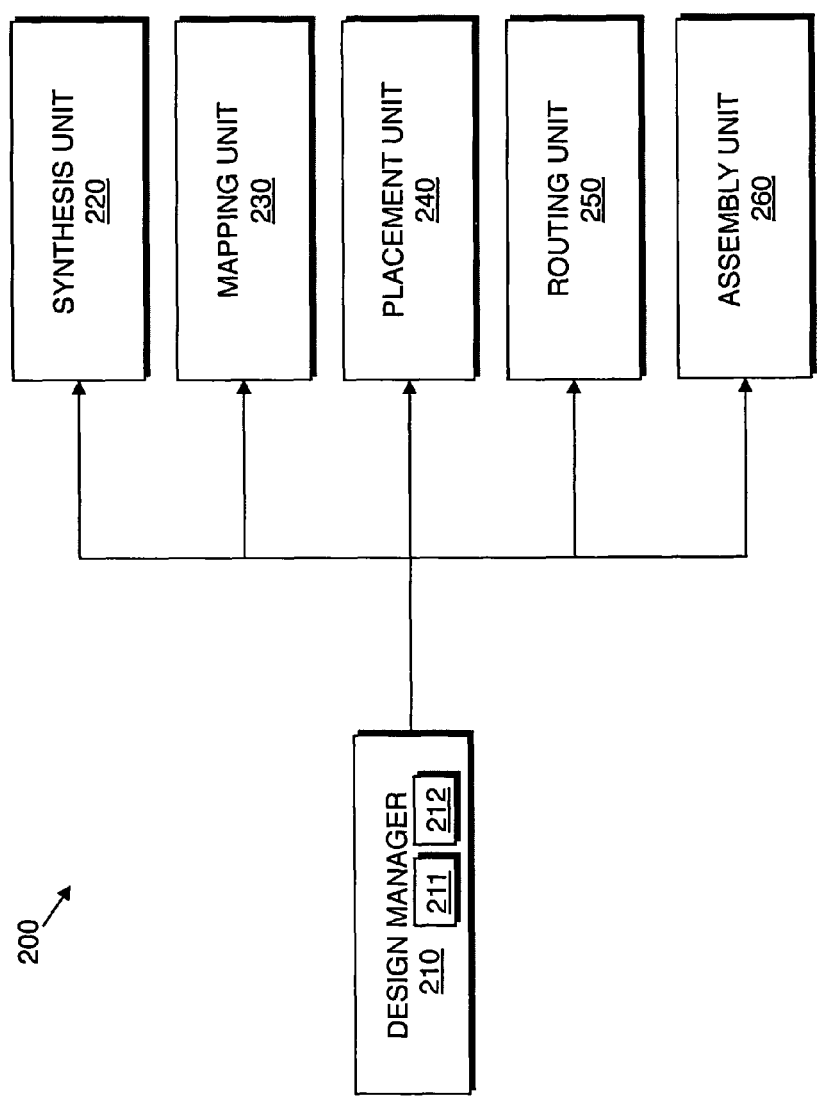
FIG. 2 illustrates a system designer according to an exemplary embodiment of the present invention.

FIG. 2 illustrates a system designer 200 according to an embodiment of the present invention. The system designer 200 may be an EDA tool for designing a system on a target device such as an FPGA, structured application structured integrated circuit (ASIC), ASIC, or other circuitry. FIG. 2 illustrates modules implementing an embodiment of the system designer 200. According to one embodiment, the modules represent software modules and system design may be performed by a computer system such as the one illustrated in FIG. 1 executing sequences of instructions represented by the modules shown in FIG. 2. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software.

The system designer 200 includes a designer manager 210. The designer manager 210 is connected to and transmits data between the components of the system designer 200. The designer manager 210 also generates an intermediate representation of the system from a description of the system input by a designer. The designer may use the designer manager 210 to create a structural netlist using a programming language construct supported by the designer manager 210. Alternatively, the designer may use a graphical user interface (GUI) unit 211 in the design manager 210 to create a block based schematic that may be converted into a structural netlist. According to an embodiment of the present invention, the GUI unit 211 provides a GUI to allow a designer to form a block based schematic. Using the GUI, the designer may access a library 212 in the design manager 210 that includes a plurality of functional units, represented as blocks, that may be selected and connected together to form the block based schematic. The library of functional units may be technology independent and applied to target devices of any architecture. The structural netlist describes the components and connectivity of the system. The design manager 210 generates a register transfer language (RTL) representation of the system from the intermediate representation of the description of the system. The RTL representation may be in a hardware description language such as Verilog, very-high-speed integrated circuit (VHSIC) hardware description language (VHDL), or other descriptive language.

The system designer 200 includes a synthesis unit 220 that performs synthesis. The synthesis unit 220 generates a logic design of a system to be implemented on the target device. According to an embodiment of the system designer 200, the synthesis unit 220 takes a conceptual HDL design definition and generates an optimized logical representation of the system. The optimized logical representation of the system generated by the synthesis unit 220 may include a representation that has a minimized number of functional blocks and registers, such as logic gates and logic elements, required for the system. Alternatively, the optimized logical representation of the system generated by the synthesis unit 220 may include a representation that has a reduced depth of logic and that generates a lower signal propagation delay.

The system designer 200 includes a technology mapping unit 230 that performs technology mapping. The technology mapping unit 230 determines how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA, the technology-mapped netlist may include cells such as logic array blocks (LABs), registers, memory blocks, digital signal processing (DSP) blocks, input output (IO) elements or other components.

The system designer 200 includes a placement unit 240 that processes the optimized technology-mapped netlist to produce a placement for each of the functional blocks. The placement identifies which components or areas on the target device are to be used for specific functional blocks and registers.

The system designer 200 includes a routing unit 250 that performs routing. The routing unit 250 determines the routing resources on the target device to use to provide interconnection between the components implementing functional blocks and registers of the logic design.

The system designer 200 includes an assembly unit 260 that performs an assembly procedure that creates a data file that includes the design of the system generated by the system designer 200. The data file may be a bit stream that may be used to program the target device. The assembly unit 260 may output the data file so that the data file may be stored or alternatively transmitted to a separate machine used to program the target device. It should be appreciated that the assembly unit 260 may also output the design of the system in other forms such as on a display device or other medium.

Figure 3:
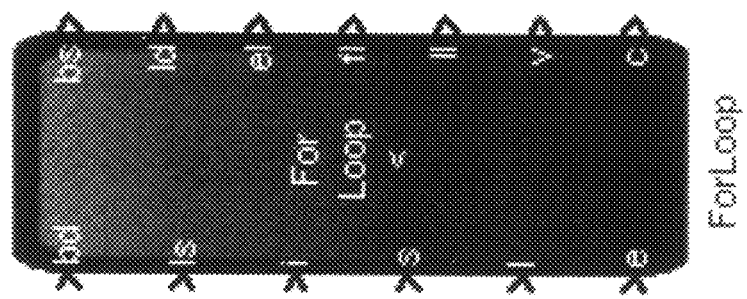
FIG. 3 illustrates a For Loop block according to an exemplary embodiment of the present invention.

FIG. 3 illustrates a For Loop block 300 according to an exemplary embodiment of the present invention. According to an embodiment of the present invention, the For Loop block 300 resides in the library 212 (shown in FIG. 2). Using a GUI provided by GUI unit 211 (shown in FIG. 2), a designer may select the For Loop block 300 to use in a block based schematic. The For Loop block 300 may be implemented as hardware on a target device. According to an embodiment of the present invention, the For Loop block 300 includes a token passing system and a counter. A plurality of For Loop blocks 300 may be connected to form loop structures such as triangular loops, parallel loops, sequential loops, and other loops, or to form state machines.

The For Loop block 300 may be programmed with a static loop test parameter that allows its counter to count up or down. The test parameter is used in a loop test, which compares a counter value with a limit value. The test parameter may specify the type of comparison such as <= or < for counting up, and >= or > for counting down.

The For Loop block 300 includes a plurality of input and output ports, which allow it to perform a number of functions. Loop parameterization inputs at input ports i (initial), s (step), and l (limit) set the initial value of the counter, the step value of the counter, and the limit value of the counter of the loop respectively. These loop parameters are used with the loop test to control the operation of a loop supported by the For Loop block 300. According to an embodiment of the present invention, the loop parameters are held constant when the loop is in an active state, but may be changed when the loop is in an inactive state. This allows for different activations of the For Loop block to have different start or end points.

A loop outputs at output port c (counter) represents the counter value of the For Loop block 300. According to an embodiment of the present invention, the value at output port c is reliable when an output at output port v (valid) is present to indicate the validity of the data. A loop input at input port e (enable) operates to enable the For Loop block 300. The signal to input port e may be used to suspend and resume operation of the For Loop block 300. According to an embodiment of the present invention, when the For Loop block 300 is disabled, the valid signal to input port v will go low, however, no changes will be made to the internal state of the For Loop block 300. When the For Loop block 300 is re-enabled, the For Loop block 300 will resume counting from the state at which it was suspended.

A loop output at output port fl (first loop) indicates that a first loop iteration is occurring. A loop output at output port ll (last loop) indicates that a last loop iteration is occurring. A loop output at output port el (empty loop) indicates that the For Loop block 300 is processing an empty loop where no values are in the range specified by the loop parameters.

Input ports ls (loop start) and bd (body done) and output ports bs (body start) and ld (loop done) are used to receive and transmit signals used as a control token. The control token allows a plurality of For Loop blocks to operate together to form a variety of control structures. When a token is received at input port ls, the For Loop block 300 initializes. The loop counter is set to its initial value specified by the input at input port i. When a token is received at input port bd, the loop counter is incremented by the step value specified at input port s. In both cases, the value of the counter is compared with the limit value specified at input port l using a statically-configured loop test. If the loop test passes, the control token is output at output port bs to initiate execution of a loop body and a signal is output at output port v. If the loop test fails, the For Loop block outputs the control token on output port ld to indicate that execution of the loop is complete and no signal is output at output port v. The For Loop block 300 becomes active when it receives a token on input port ls, and remains active until it outputs a token on output port ld.

Figure 4:
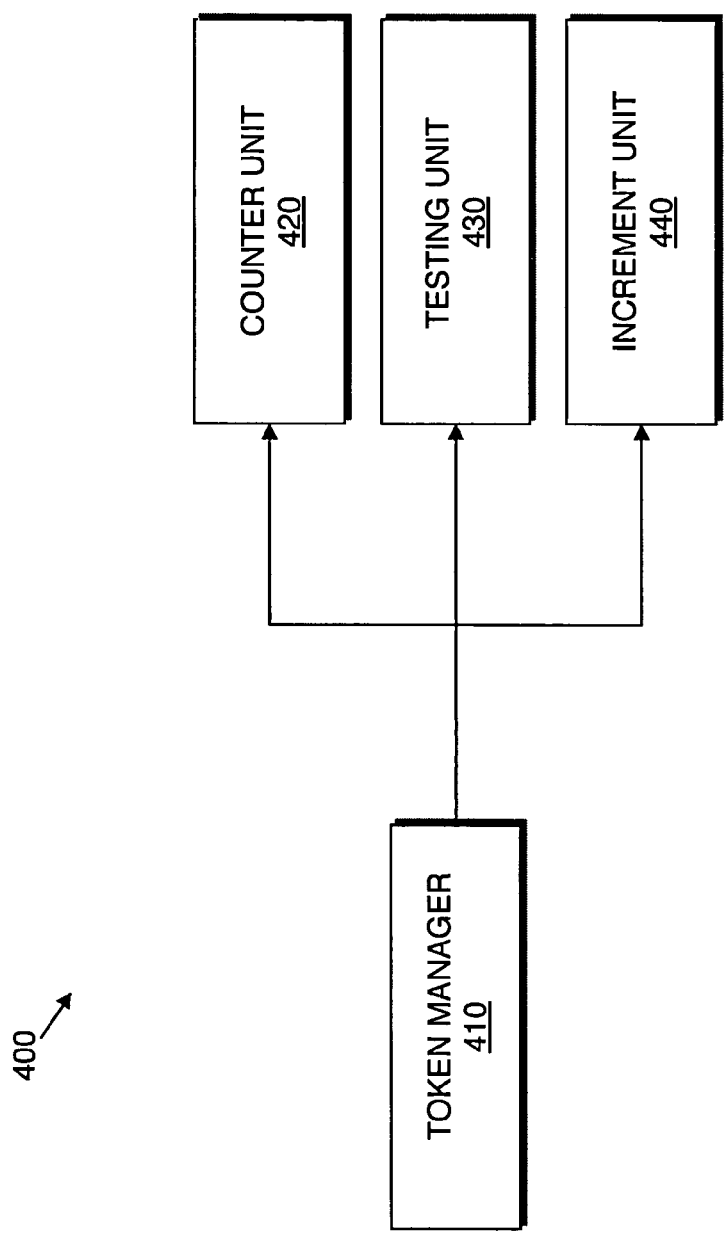
FIG. 4 illustrates a block diagram of a token passing unit according to an exemplary embodiment of the present invention.

FIG. 4 illustrates a block diagram of a token passing unit 400 according to an exemplary embodiment of the present invention. The token passing unit 400 resides in a For Loop block implemented in hardware on a target device. The token passing unit 400 includes a token manager 410. The token manager 410 is connected to and transmits data between the components of the token passing unit 400.

The token passing unit 400 includes a counter unit 420. In response to receiving a token at input port ls, the counter unit 420 initializes a counter with an initial value received at input port i, programs the counter to use a step value received at input port s, and programs a loop test to recognize a limit value received at input port l.

The token passing unit 400 includes a testing unit 430. In response to receiving a token at input port ls or a token at input port bd, the testing unit 430 performs a loop test where the value of the counter is compared with the limit value. In response to passing the loop test, the testing unit 430 outputs a token at the output port bs and outputs a signal through output port v. In response to failing the loop test, the testing unit 430 outputs a token at the output port bd and outputs no signal at output port v.

The token passing unit 400 includes an increment unit 440. In response to receiving a token at input port bd, the increment unit 440 increments the counter by a step value.

Figure 5:
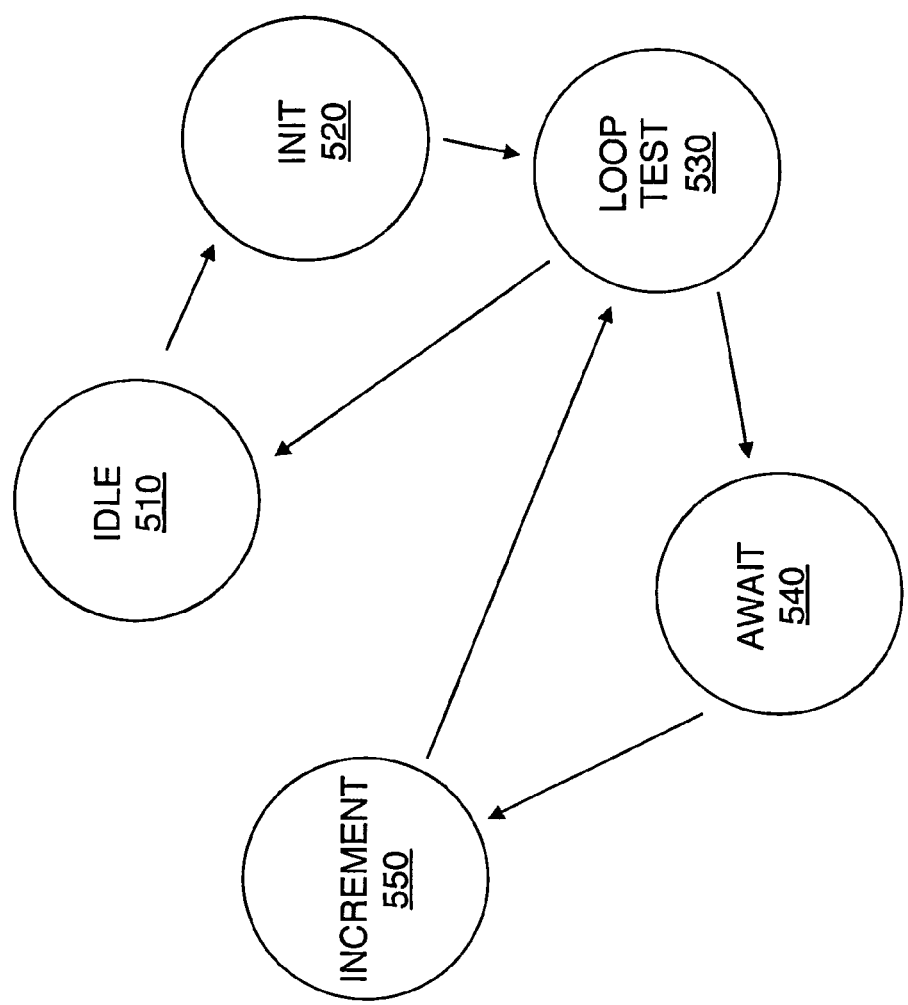
FIG. 5 illustrates states of a For Loop block according to an embodiment of the present invention.

FIG. 5 illustrates states of a For Loop block according to an embodiment of the present invention. The states of the For Loop block may be implemented by hardware on a target device. At 510, the For Loop block is in an idle state. Upon receiving a token at input port ls, the For Loop block enters an initialization state.

At 520, the For Loop block is in the initialization (Init) state. At the initialization state, the initial value of the counter, the step value, and limit of the counter are set. After the initialization state, the For Loop block enters a loop test state.

At 530, the For Loop block is in the loop test state. At the loop test state, the value of the counter is compared with the limit value. The comparison may involve a less than, less than equal to, greater than, or greater than equal to comparison. If the conditions of the loop test are true and the loop test is passed, the For Loop block enters the await state and a token is output at output port bs. If the conditions of the loop test are false and the loop test is failed, the For Loop block returns to the idle state and a token is output at output port ld.

At 540, the For Loop block is in the await state. At the await state, the For Loop counter is not incremented, and the For Loop block is waiting to receive a token at the input port bd. The token may be passed to the input port bd from another port on the same For Loop block or from another port on another For Loop block. Upon receiving a token at the input port bd, the For Loop block enters the increment state.

At 550, the For Loop block is in the increment state. At the increment state, the counter value is incremented by the step value. The For Loop block then returns to the loop test state.

Figure 6:
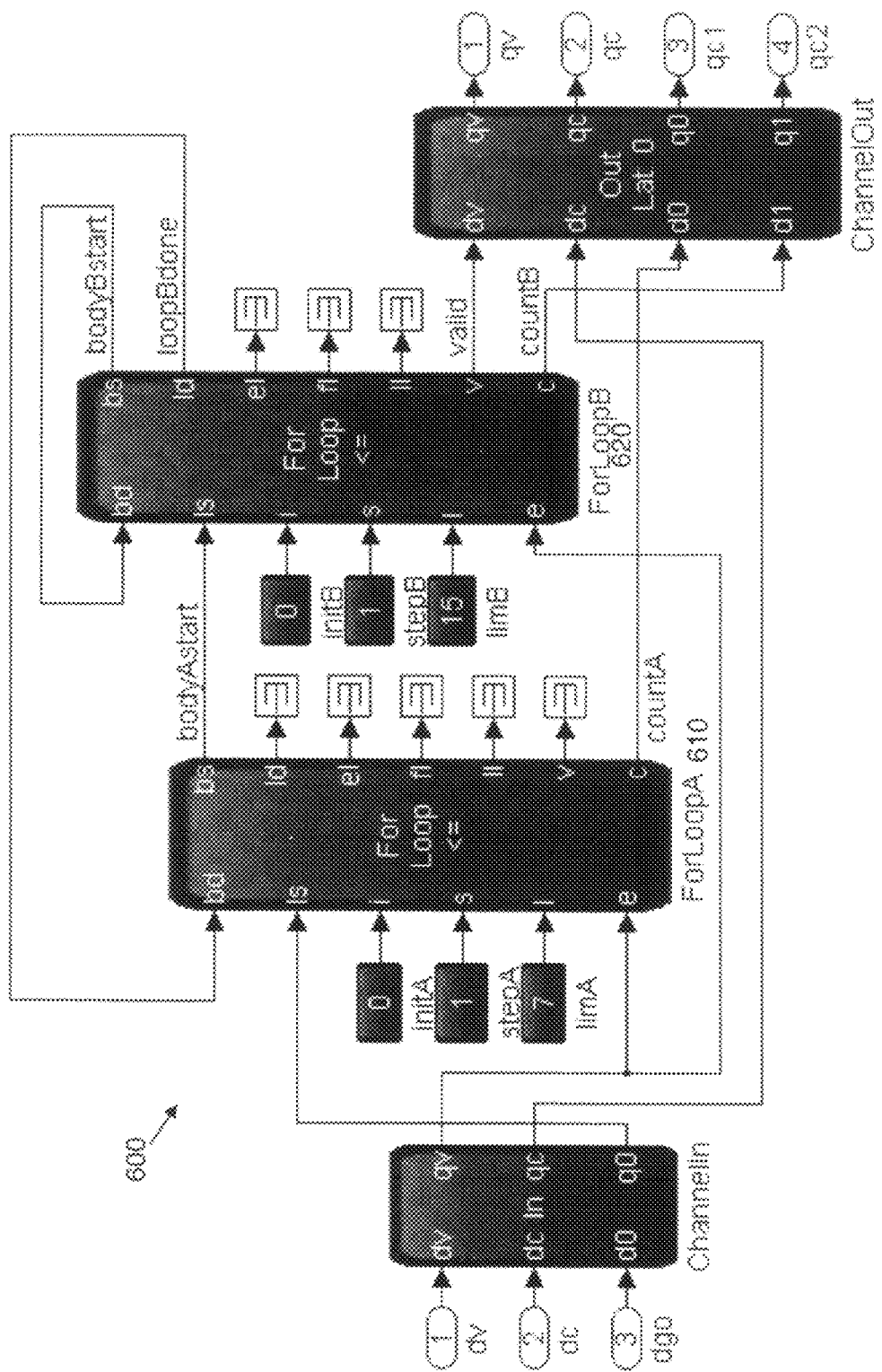
FIG. 6 is a block based schematic of a circuit operable to implement a rectangular nested loop according to an exemplary embodiment of the present invention.

FIG. 6 illustrates a block based schematic of a circuit 600 operable to implement a rectangular nested loop according to an exemplary embodiment of the present invention. The circuit 600 is configured to implement the following rectangular nested loop as described in C programming code.

```
for (uint8 countA = 0; countA <= 7; countA++){
    qc1 = countA;
    for (uint8 countB = 0; countB <= 15; countB++){
        qc2 = countB;
    }
}
```

The circuit 600 includes a first For Loop block 610 which provides an outer loop and a second For Loop block 620 which provides an inner loop. As shown in FIG. 6, the initialization, step, and limit values for the counters of the first For Loop block 610 and the second For Loop block 620 are programmed with constants at input ports i, s, and l of both the For Loop blocks 610 and 620.

In order to connect the outer loop with the inner loop, the first For Loop block 610 passes a token from its output port bs to the input port ls of the second For Loop block 620. The output port bs of the second For Loop block 620 passes a token back to the input port bd of the second For Loop block 620 so that the next iteration of the inner loop starts immediately after the previous iteration. After all iterations of the inner loop are completed, the second For Loop block 620 passes a token from its output port ld to the input port bd of the first For Loop block 610.

FIGS. 7A-7C illustrate outputs of the circuit 600 (shown in FIG. 6) implementing the rectangular nested loop according to an exemplary embodiment of the present invention. FIG. 7A illustrates a plot of the valid signal output at output port v of the second For Loop block 620 over time. FIG. 7B illustrates a plot of the counter value output at output port c of the first For Loop block 610 over time. A stair step plot with equally spaced steps illustrates the time an outer loop spends waiting for the inner loop to complete. Since the number of iterations of the inner loop is the same over time, the amount of time the outer loop is at each outer loop iteration is also the same over time. FIG. 7C illustrates a plot of the counter value output at output port c of the second For Loop block 620 over time. The height and width of each spike is the same over time because the limit on the number of iterations required for the inner loop is also the same over time.

FIG. 8 illustrates a loop diagram of the rectangular nested loop according to an exemplary embodiment of the present invention. The circles in each row illustrate iterations of the inner loop occurring during an iteration of the outer loop. As the iterations of the inner loop are completed, a counter of the outer loop is incremented and a next row illustrates iterations of the inner loop occurring in the next outer loop. As shown, since the limit value of the inner loop stays constant with each iteration of the outer loop, the loop diagram resembles a rectangular structure.

Figure 9:
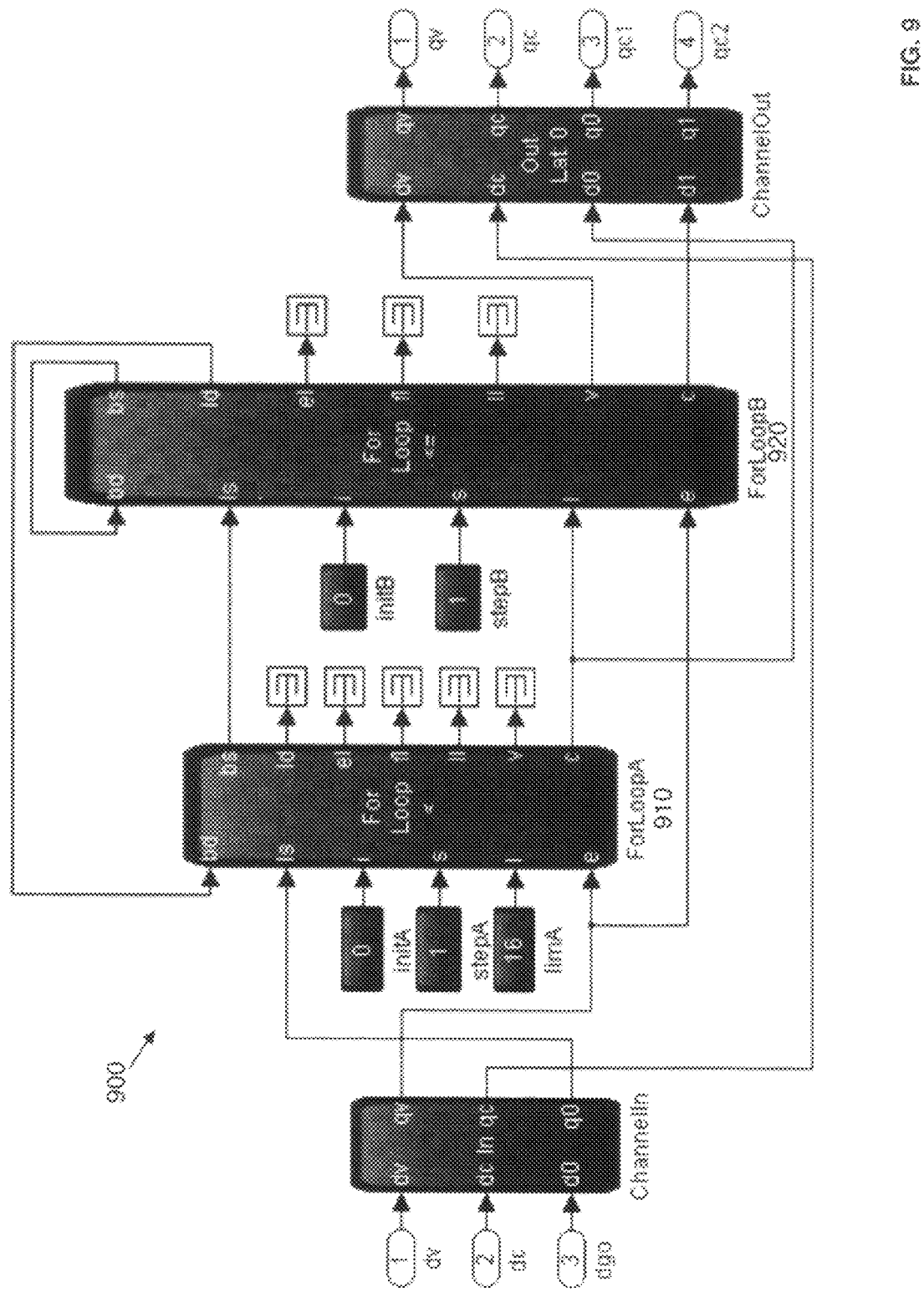
FIG. 9 is a block based schematic of a circuit operable to implement a triangular nested loop according to an exemplary embodiment of the present invention.

FIG. 9 illustrates a block based schematic of a circuit 900 operable to implement a triangular nested loop according to an exemplary embodiment of the present invention. The circuit 900 is configured to implement the following triangular nested loop as described in C programming code.

```
for (uint8 countA = 0; count A <16; count A++){
    qc1 = countA;
    for (uint8 countB = 0; countB <= countA; countB++){
        qc2 = countB;
    }
}
```

The circuit 900 includes a first For Loop block 910 which provides an outer loop and a second For Loop block 920 which provides an inner loop. As shown in FIG. 9, the initialization, step, and limit values for the counter of the first For Loop block 910 are programmed with constants at input ports i, s, and l. The initialization and step values for the counter of the second For Loop block 920 are also programmed with constants at input ports i and s. The limit value for the counter of the second For Loop block 920 is programmed with the counter value of the first For Loop block 910 output at output port c.

In order to connect the outer loop with the inner loop, the first For Loop block 910 passes a token from its output port bs to the input port ls of the second For Loop block 920. The output port bs of the second For Loop block 920 passes a token back to the input port bd of the second For Loop block 920 so that the next iteration of the inner loop starts immediately after the previous iteration. After all iterations of the inner loop are completed, the second For Loop block 920 passes a token from its output port ld to the input port bd of the first For Loop block 910.

Figures 10A, 10B, 10C:
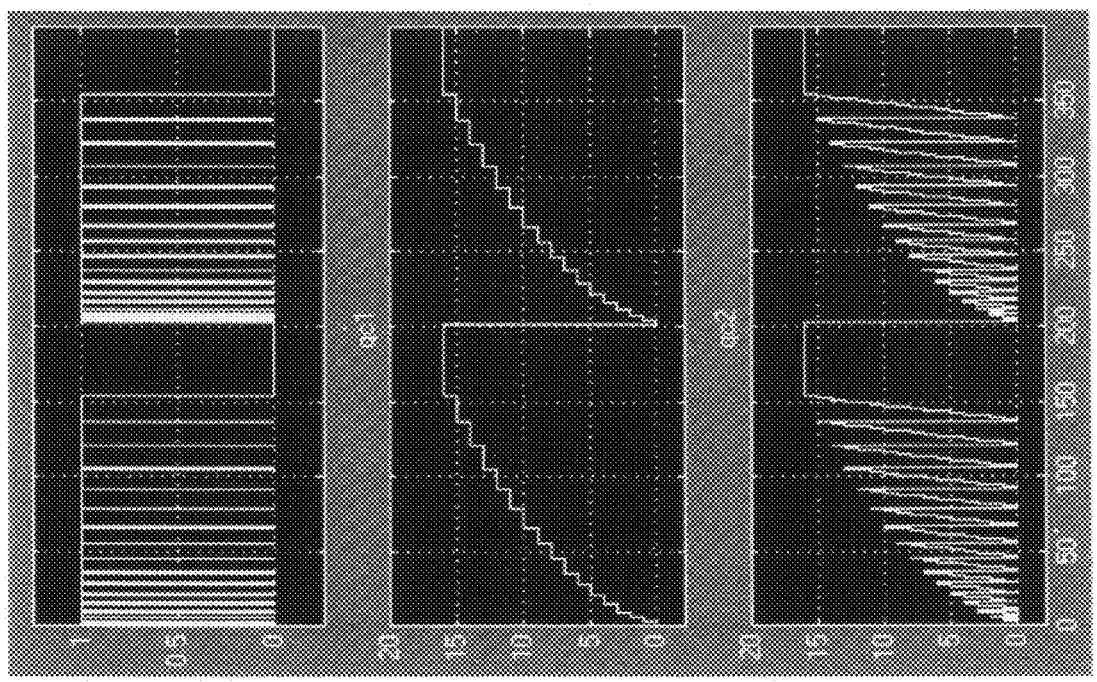
FIG. 10 illustrates the outputs of the circuit of FIG. 9 according to an exemplary embodiment of the present invention.

FIGS. 10A-10C illustrate outputs of the circuit 900 (shown in FIG. 9) implementing the triangular nested loop according to an exemplary embodiment of the present invention. FIG. 10A illustrates a plot of the valid signal output at output port v of the second For Loop block 920 over time. FIG. 10B illustrates a plot of the counter value output at output port c of the first For Loop block 910 over time. A non-equally spaced stair step plot illustrates the longer the time an outer loop waits for the inner loop to complete with each iteration of the outer loop. FIG. 10C illustrates a plot of the counter value output at output port c of the second For Loop block 920 over time. The height and width of each spike increases over time as the limit of the number of iterations required for the inner loop increases with each iteration of the outer loop.

FIG. 11 illustrates a loop diagram of the triangular nested loop according to an exemplary embodiment of the present invention. The circles in each row illustrate iterations in the inner loop occurring during an iteration of the outer loop. As the iterations of the inner loop are completed, a counter of the outer loop is incremented and a next row illustrates iterations in the inner loop occurring in the next outer loop. As shown, since the limit value of the inner loop increases with each iteration of the outer loop, the loop diagram resembles a triangular structure.

Figure 12:
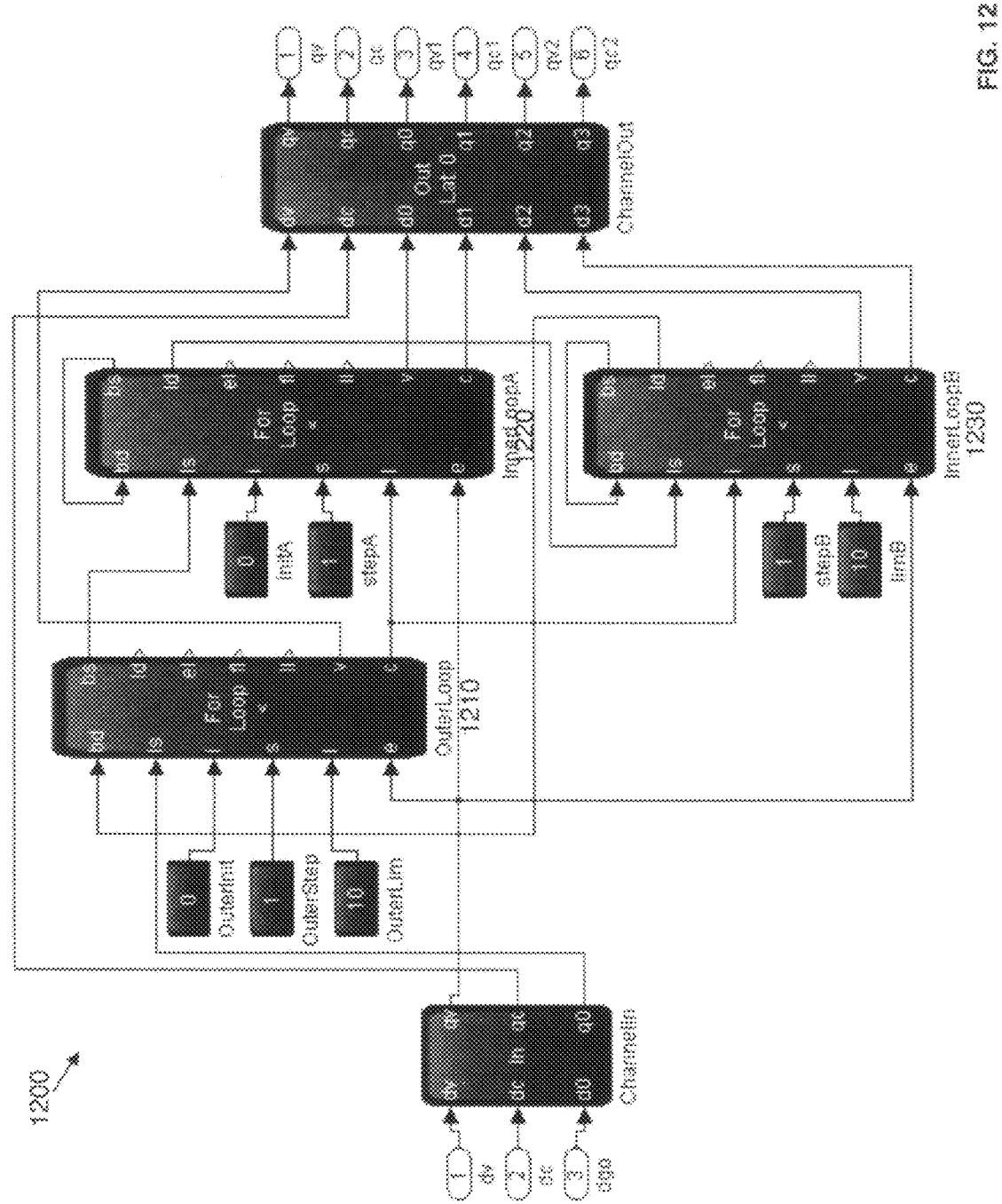
FIG. 12 is a block based schematic of a circuit operable to implement sequential loops according to an exemplary embodiment of the present invention.

FIG. 12 illustrates a block based schematic of a circuit 1200 operable to implement sequential loops according to an exemplary embodiment of the present invention. The circuit 1200 is configured to implement the following sequential loops as described in C programming code.

```
for (uint8 cOuter = 0; cOuter <=10; cOuter ++){
    for (uint8 cInnerA = 0; cInnerA < cOuter; cInnerA++){
        qc1 = cInnerA;
    }
    for (uint8 cInnerB = cOuter; cInnerB < 10; cInnerB++){
        qc2 = cInnerB;
    }
}
```

The circuit 1200 includes a first For Loop block 1210 which provides an outer loop, a second For Loop block 1220 which provides a first inner loop, and a third For Loop block 1230 which provides a second inner loop. As shown in FIG. 12, the initialization, step, and limit values for the counter of the first For Loop block 1210 are programmed with constants at input ports i, s, and l. The initialization and step values for the counter of the second For Loop block 1220 are programmed with constants at input ports i and s. The limit value for the counter of the second For Loop block 1220 is programmed with the counter value of the first For Loop block 1210 output at output port c. The initialization value for the counter of the third For Loop block 1230 is programmed with the counter value of the first For Loop block 1210 output at output port c. The step and limit values for the counter of the third For Loop block 1230 are programmed with constants at input ports s and l.

In order to connect the outer loop with the inner loops, the first For Loop block 1210 passes a token from its output port bs to the input port ls of the second For Loop block 1220. The output port bs of the second For Loop block 1220 passes a token back to the input port bd of the second For Loop block 1220 so that the next iteration of the inner loop starts immediately after the previous iteration. After all iterations of the first inner loop are completed, the second For Loop block 1220 passes a token from its output port ld to the input port ls of the third For Loop block 1230. This connects the first inner loop with the second inner loop sequentially. After all iterations of the second inner loop are completed, the third For Loop block 1230 passes a token from its output port ld to the input port bd of the first For Loop block 1210.

Figures 13A, 13B, 13C, 13D:
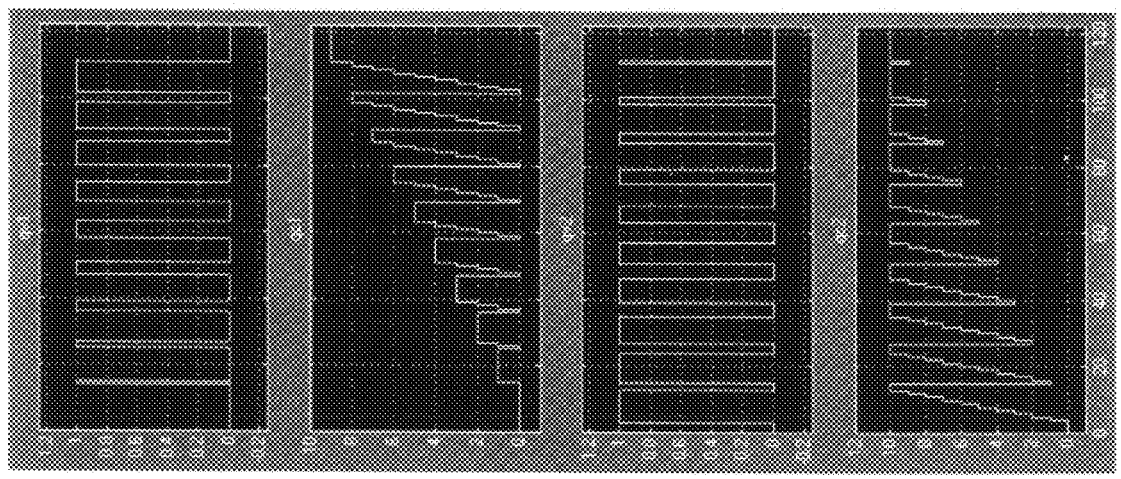
FIG. 13 illustrates the outputs of the sequential loops according to an exemplary embodiment of the present invention.

FIGS. 13A-13D illustrate outputs of the circuit 1200 (shown in FIG. 12) implementing the sequential loops according to an exemplary embodiment of the present invention. FIG. 13A illustrates a plot of the valid signal output at output port v of the second For Loop block 1320 over time. FIG. 13B illustrates a plot of the counter value output at output port c of the second For Loop block 1320 over time. FIG. 13 C illustrates a plot of the valid signal output at output port v of the third For Loop block 1330 over time. As illustrated, the valid signal is only output at either output port v of the second For Loop block 1320 or the third For Loop block 1330 at any one time. FIG. 13D illustrates a plot of the counter value output at output port c of the third For Loop block 1330 over time.

Figure 14:
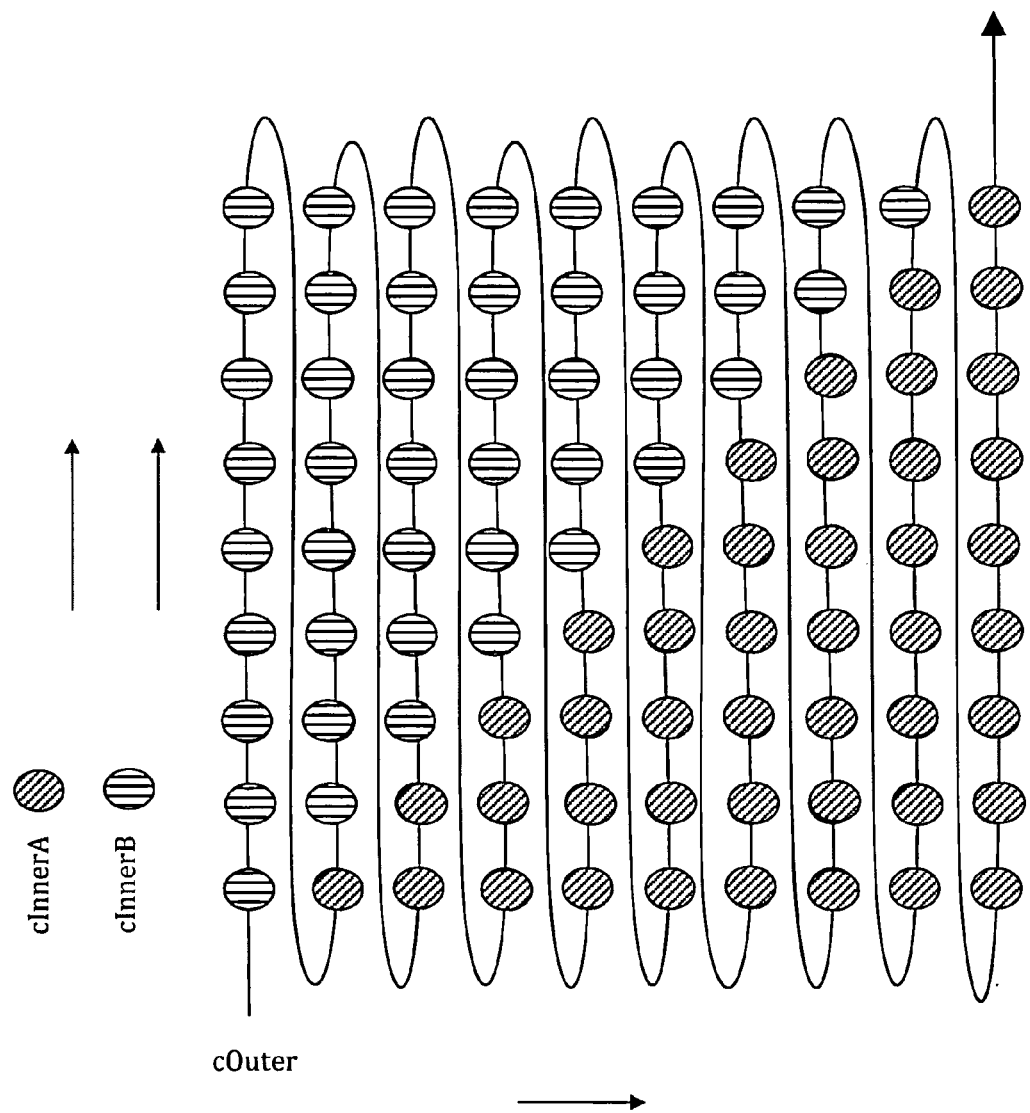
FIG. 14 illustrates a loop diagram of the sequential loops according to an exemplary embodiment of the present invention.

FIG. 14 illustrates a loop diagram of the sequential loops according to an exemplary embodiment of the present invention. Since with each iteration of the outer loop both the limit value of the counter of first inner loop and the initialization value of the counter of the second inner loop increases, the loop diagram resembles a square structure.

Figure 15:
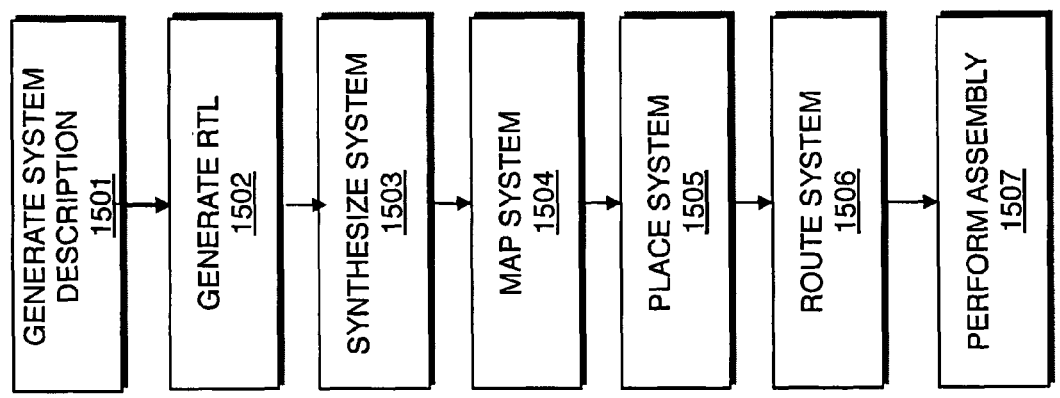
FIG. 15 is a flow chart illustrating a method for designing a system on target devices according to an exemplary embodiment of the present invention.

FIG. 15 is a flow chart illustrating a method for designing a system on a target device according to an embodiment of the present invention. The procedure shown in FIG. 15 may be performed by an EDA tool such as a system designer implemented on a computer system. At 1501, a description of the system is generated. According to an embodiment of the present invention, a structural netlist may be generated from an initial description provided by the designer in a block based schematic created from a graphical user interface tool. The graphical user interface tool may include a library of functional units that may be selected and connected together to form the block based schematic. The structural netlist describes the components and connectivity of the system. According to an embodiment of the present invention, one or more For Loop blocks are used in the block based to create a control loop. Each for loop block includes a token passing unit that is operable to pass a token through either a first output port or a second output depending on a result from a loop test. The For Loop block also includes a counter that is operable to increment a step value in response to the For Loop block receiving the token.

At 1502, a register transfer language (RTL) representation of the system is generated from the intermediate representation of the description of the system. The RTL representation may be in a hardware description language such as Verilog or very-high-speed integrated circuit (VHSIC) hardware description language (VHDL), or other descriptive language.

At 1503, synthesis is performed on the system design. According to an embodiment of the present invention, synthesis generates an optimized logical representation of the system from a HDL design definition. The optimized logical representation of the system may include a representation that has a minimized number of functional blocks such as logic gates, logic elements, and registers required for the system.

At 1504, technology mapping is performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, an optimized technology-mapped netlist generated from the HDL.

At 1505, the mapped logical system design is placed. Placement works on the optimized technology-mapped netlist to produce a placement for each of the functional blocks. According to an embodiment of the present invention, placement includes fitting the system on the target device by determining which resources available on the target device are to be used for specific function blocks in the optimized technology-mapped netlist. According to an embodiment of the present invention, placement may include clustering which involves grouping logic elements together to form the logic clusters present on the target device.

At 1506, it is determined which routing resources should be used to connect the components in the target device implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 1507, an assembly procedure is performed. The assembly procedure involves creating a data file that includes some of the information determined by the procedure described. The data file may be a bit stream that may be used to program the target device. According to an embodiment of the present invention, the procedures illustrated in FIG. 15 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

FIG. 15 is a flow chart illustrating a method for designing a system on a target device according to embodiments of the present invention. The techniques illustrated in FIG. 15 may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Figure 16:
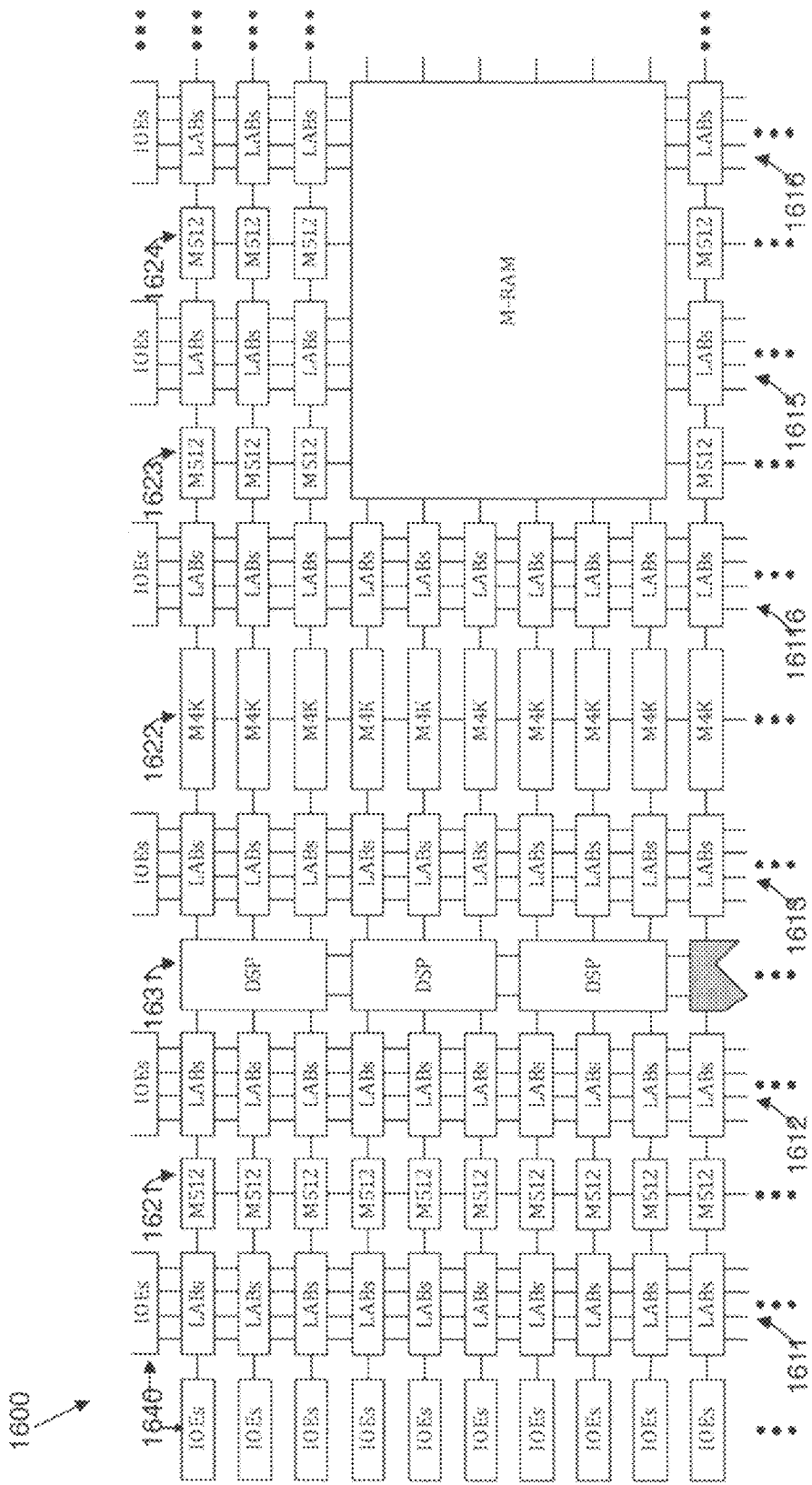
FIG. 16 illustrates an exemplary target device according to an exemplary embodiment of the present invention.

FIG. 16 illustrates an exemplary target device 1600 in which a system may be implemented on 1600 utilizing an FPGA according to an embodiment of the present invention. According to one embodiment, the target device 1600 is a chip having a hierarchical structure that may take advantage of wiring locality properties of circuits formed therein.

The target device 1600 includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix manufactured by Altera® Corporation. In this embodiment, the logic block may include a four input lookup table (LUT) with a configurable register. According to an alternate embodiment of the present invention, the logic block may operate similarly to an adaptive logic module (ALM), such as those found in Stratix II manufactured by Altera® Corporation. LABs are grouped into rows and columns across the target device 1600. Columns of LABs are shown as 1611-1616. It should be appreciated that the logic block may include additional or alternate components.

The target device 1600 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 1600. Columns of memory blocks are shown as 1621-1624.

The target device 1600 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 1600 and are shown as 1631.

The target device 1600 includes a plurality of input/output elements (IOEs) 1640. Each IOE feeds an I/O pin (not shown) on the target device 1600. The IOEs are located at the end of LAB rows and columns around the periphery of the target device 1600. Each IOE includes a bidirectional I/O buffer and a plurality of registers for registering input, output, and output-enable signals. When used with dedicated clocks, the registers provide performance and interface support with external memory devices.

The target device 1600 may include routing resources such as LAB local interconnect lines, row interconnect lines ("H-type wires"), and column interconnect lines ("V-type wires") (not shown) to route signals between components on the target device.

FIG. 16 illustrates an exemplary embodiment of a target device. It should be appreciated that a system may include a plurality of target devices, such as that illustrated in FIG. 16, cascaded together. It should also be appreciated that the target device may include parameterizable logic devices arranged in a manner different than that on the target device 1600. A target device may also include FPGA resources other than those described in reference to the target device 1600.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "machine accessible medium" or "machine readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A user selectable block in a graphical user interface of an electronic design automation tool comprising:
a token passing unit that passes a token through one of a first output port and second output port, wherein selection of a port for passing the token is in response to a result from a loop test; and
a first counter that increments a step value in response to receiving the token at a first input port of the user selectable block, wherein a signal is output from a third output port in response to the first counter executing one of a first loop iteration, a last loop iteration, and an empty loop.

2. The user selectable block of claim 1, wherein the token passing unit comprises a testing unit that performs the loop test where a value of the first counter is compared with a limit value.

3. The user selectable block of claim 1 further comprising a second counter that programs the first counter in response to receiving the token at a second input port of the user selectable block.

4. The user selectable block of claim 2, wherein the loop test is programmable to perform one of a less than, less than or equal to, greater than, or greater than or equal to comparison of the value of the first counter with the limit value.

5. The user selectable block of claim 3, wherein the second counter initializes the first counter with an initial value received at a third input port of the user selectable block, program the first counter to use a step value received at a fourth input port of the user selectable block, and program the loop test to recognize a limit value received at a fifth input port of the user selectable block.

6. A circuit comprising:
a first block comprising a first token passing unit that passes a token through one of a first output port of the first block and a second output port of the first block in response to a result from a first loop test, and a first counter that increments a first step value in response to the first block receiving the token at a first input port of the first block; and
a second block comprising a second token passing unit that passes the token through one of a first output port of the second block and a second output port of the second block in response to a result from a second loop test having a limit value transmitted from the first counter, and a second counter that increments a second step value in response to the second block receiving the token at a first input port of the second block.

7. The circuit of claim 6, wherein the second token passing unit comprises a counter unit that programs the second counter in response to receiving the token at a second input port of the second block originating from the first output port of the first block.

8. The circuit of claim 7, wherein the counter unit initializes the second counter with an initial value received at a third input port of the second block, program the second counter to use a step value received at a fourth input port of the second block, and program the loop test to use the limit value received from the first counter at a fifth input port of the second block.

9. The circuit of claim 6, wherein the second token passing unit comprises an increment unit that increments the second counter in response to receiving the token at the first input port of the second block from the first output port of the second block.

10. The circuit of claim 6, wherein the first token passing unit comprises an increment unit that increments the first counter in response to receiving the token at the first input port of the first block from the second output port of the second block.

11. The circuit of claim 6, wherein the second token passing unit comprises a testing unit that performs the second loop test where a value of the second counter is compared to the limit value received from the first counter.

12. A circuit comprising:
a first block comprising a first token passing unit that passes a token through one of a first output port of the first block and a second output port of the first block in response to a result from a first loop test, and a first counter that increments a first step value in response to the first block receiving the token at a first input port on the first block;
a second block comprising a second token passing unit that passes the token through one of a first output port of the second block and a second output port of the second block in response to a result from a second loop test having a limit value transmitted from the first counter, and a second counter that increments a second step value in response to the second block receiving the token at a first input port on the second block; and
a third block comprising a third token passing unit that passes the token through one of a first output port of the second block and a second output port of the third block in response to a result from a third loop test, and a third counter, initialized by a value received from the first counter, that increments a third step value in response to the third block receiving the token at a first input port on the third block.

13. The circuit of claim 12, wherein the second token passing unit comprises a counter unit that programs the second counter in response to receiving the token at a second input port of the second block originating from the first output port of the first block.

14. The circuit of claim 13, wherein the counter unit initializes the second counter with an initial value received at a third input port of the third block, program the counter to use a step value received at a fourth input port of the third block, and program the third loop test to recognize the limit value received from the first counter at a fifth input port of the third block.

15. The circuit of claim 12, wherein the second token passing unit comprises an increment unit that increments the second counter in response to receiving the token at the first input port on the second block from the first output port of the second block.

16. The circuit of claim 12, wherein the first token passing unit comprises an increment unit that increments the first counter in response to receiving the token at the first input port of the first block from the second output port of the third block.

17. The circuit of claim 12, wherein the second token passing unit comprises a testing unit that performs the second loop test where a value of the second counter is compared to the limit value received from the first counter.

18. The circuit of claim 12, wherein the third token passing unit comprises a counter unit that programs the third counter in response to receiving the token at a second input port of the third block originating from the second output port of the second block.

19. The circuit of claim 18, wherein the counter unit initializes the third counter with an initial value received from the first counter at a third input port on the third block, program the third counter to use a step value received at a fourth input port on the third block, and program the third loop test to recognize a limit value received at a fifth input port on the third block.

20. The circuit of claim 12, wherein the third token passing unit comprises an increment unit that increments the third counter in response to receiving the token at the first input port of the third block from the first output port of the third block.

* * * * *